(12) United States Patent
Tamura et al.

(10) Patent No.: US 9,368,341 B2
(45) Date of Patent: Jun. 14, 2016

(54) METHOD OF MANUFACTURING A SILICON OXIDE FILM

(71) Applicant: Tokyo Electron Limited, Tokyo (JP)

(72) Inventors: Tatsuya Tamura, Iwate (JP); Takeshi Kumagai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/480,748

(22) Filed: Sep. 9, 2014

(65) Prior Publication Data

US 2015/0079807 A1    Mar. 19, 2015

(30) Foreign Application Priority Data

Sep. 13, 2013  (JP) .................... 2013-191060

(51) Int. Cl.
| | |
|---|---|
| *H01L 21/02* | (2006.01) |
| *C23C 16/455* | (2006.01) |
| *C23C 16/40* | (2006.01) |
| *C23C 16/458* | (2006.01) |

(52) U.S. Cl.
CPC ........ *H01L 21/02164* (2013.01); *C23C 16/402* (2013.01); *C23C 16/4584* (2013.01); *C23C 16/45523* (2013.01); *H01L 21/02219* (2013.01); *H01L 21/02271* (2013.01)

(58) Field of Classification Search
None
See application file for complete search history.

(56) References Cited

U.S. PATENT DOCUMENTS

| | | | | | |
|---|---|---|---|---|---|
| 5,567,243 | A | * | 10/1996 | Foster et al. ................. | 118/730 |
| 5,628,829 | A | * | 5/1997 | Foster et al. ............. | 118/723 E |
| 6,197,121 | B1 | * | 3/2001 | Gurary et al. ................. | 118/725 |
| 6,653,212 | B1 | * | 11/2003 | Yamanaka et al. ............ | 438/485 |
| 2005/0095770 | A1 | * | 5/2005 | Kumagai et al. .............. | 438/202 |
| 2007/0134419 | A1 | * | 6/2007 | Mitrovic et al. ........... | 427/255.5 |
| 2010/0037820 | A1 | * | 2/2010 | Lee ................ | 118/719 |
| 2010/0105192 | A1 | * | 4/2010 | Akae et al. ..................... | 438/478 |
| 2010/0199914 | A1 | * | 8/2010 | Iza ................. | 118/725 |
| 2011/0100489 | A1 | * | 5/2011 | Orito et al. ..................... | 137/560 |
| 2011/0104395 | A1 | * | 5/2011 | Kumagai et al. .............. | 427/554 |
| 2011/0155057 | A1 | * | 6/2011 | Kato et al. ..................... | 118/719 |
| 2011/0236598 | A1 | * | 9/2011 | Kumagai et al. .............. | 427/569 |
| 2012/0052693 | A1 | * | 3/2012 | Ozaki et al. ..................... | 438/771 |
| 2012/0222615 | A1 | * | 9/2012 | Kato et al. ..................... | 118/719 |
| 2012/0267341 | A1 | * | 10/2012 | Kato et al. ..................... | 216/37 |
| 2013/0130512 | A1 | * | 5/2013 | Kato et al. ..................... | 438/765 |
| 2013/0164942 | A1 | * | 6/2013 | Kato et al. ..................... | 438/758 |
| 2013/0189849 | A1 | * | 7/2013 | Kato et al. ..................... | 438/758 |
| 2014/0011372 | A1 | * | 1/2014 | Kato et al. ..................... | 438/787 |

FOREIGN PATENT DOCUMENTS

JP    2007-042884    2/2007

* cited by examiner

*Primary Examiner* — Brett Feeney
*Assistant Examiner* — Erik T Peterson
(74) *Attorney, Agent, or Firm* — IPUSA, PLLC

(57) ABSTRACT

A method of manufacturing a silicon oxide film by using a film deposition apparatus is provided. The apparatus includes a turntable including a substrate receiving part on its upper surface, a first gas supply part to supply a first gas to the turntable in a first process area, and a second gas supply part arranged in a second process area apart from the first process area to supply a second gas. In the method, a silicon-containing gas is supplied from the first gas supply part as the first gas. A hydrogen gas and an oxidation gas are supplied from the second gas supply part as the second gas. The first gas is caused to adsorb on the substrate in the first process area, and the second gas is caused to react with the first gas adsorbed on the substrate in the second process area while rotating the turntable.

6 Claims, 7 Drawing Sheets

METHOD OF MANUFACTURING A SILICON OXIDE FILM

CROSS-REFERENCE TO RELATED APPLICATIONS

This patent application is based upon and claims the benefit of priority of Japanese Patent Application No. 2013-191060 filed on Sep. 13, 2013, the entire contents of which are incorporated herein by reference.

BACKGROUND OF THE INVENTION

1. Field of the Invention

The present invention relates to a method of manufacturing a silicon oxide film.

2. Description of the Related Art

A silicon oxide film is widely used as an insulating film of semiconductor devices such as a semiconductor integrated circuit (IC), and conventionally, a method of depositing a silicon oxide film on a surface of a wafer (substrate) has been examined.

For example, Japanese Laid-Open Patent Application Publication No. 2007-42884 discloses a method of depositing a silicon oxide film by using a vertically extending cylindrical reaction chamber, into which a wafer boat holding a plurality of semiconductor wafers is carried, and after being evacuated and heated, TEOS gas, oxygen gas and hydrogen gas are simultaneously supplied.

However, according to a method of depositing a silicon oxide film disclosed in Japanese Laid-Open Patent Application Publication No. 2007-42884, a reaction gas supplied from a lower part of the reaction chamber such as TEOS gas passes between wafers held by the wafer boat and the reaction gas is supplied to surfaces of the wafers until the reaction gas reaches an exhaust port provided at an upper part of the reaction chamber. In other words, the reaction gas supplied to the wafer surfaces flows in parallel with the wafer surfaces by entering from one end of the wafer, passing a central part and going out of the other end. Because of this, even though the wafer boat is rotated during the film deposition, a silicon oxide film is likely to deposit on an end part and the silicon oxide film sometimes does not have a uniform film thickness between the end part and the central part.

Particularly, in recent years, because a design rule (a width of interconnections in semiconductor circuits) has been miniaturized, depositing an insulating layer having a uniform film thickness on a wafer has been required. Furthermore, cases required to deposit a silicon oxide film on a wafer having a depression that has a small opening and a deep bottom (i.e., high aspect ratio) in its surface have been increasing. In such cases, depositing the insulating film having a uniform film thickness on the wafer was sometimes difficult according to the conventional method. Accordingly, a method of depositing an insulating film having a uniform film thickness without depending on a shape of the wafer surface has been desired.

SUMMARY OF THE INVENTION

Accordingly, embodiments of the present invention may provide a novel and useful method of manufacturing a silicon oxide film that can deposit a silicon oxide film having a uniform film thickness on a surface of a wafer.

According to an embodiment of the present invention, there is provided a method of manufacturing a silicon oxide film by using a film deposition apparatus. The film deposition apparatus includes a rotatable turntable including a substrate receiving part to receive a substrate on its upper surface and provided in a vacuum chamber, a first gas supply part arranged in a first process area divided above the upper surface of the turntable and configured to supply a first gas to the upper surface of the turntable, and a second gas supply part arranged in a second process area apart from the first process area along a circumferential direction of the turntable and configured to supply a second gas to the upper surface of the turntable. In the method, a silicon-containing gas is continuously supplied from the first gas supply part as the first gas. Also, a hydrogen gas and an oxidation gas are continuously supplied from the second gas supply part as the second gas. Then, the first gas is caused to adsorb on the substrate on the upper surface of the turntable in the first process area while rotating the turntable, and the second gas supplied to the second process area is caused to react with the first gas adsorbed on the substrate in the second process area while rotating the turntable.

Additional objects and advantages of the embodiments are set forth in part in the description which follows, and in part will become obvious from the description, or may be learned, by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

Figure 1:
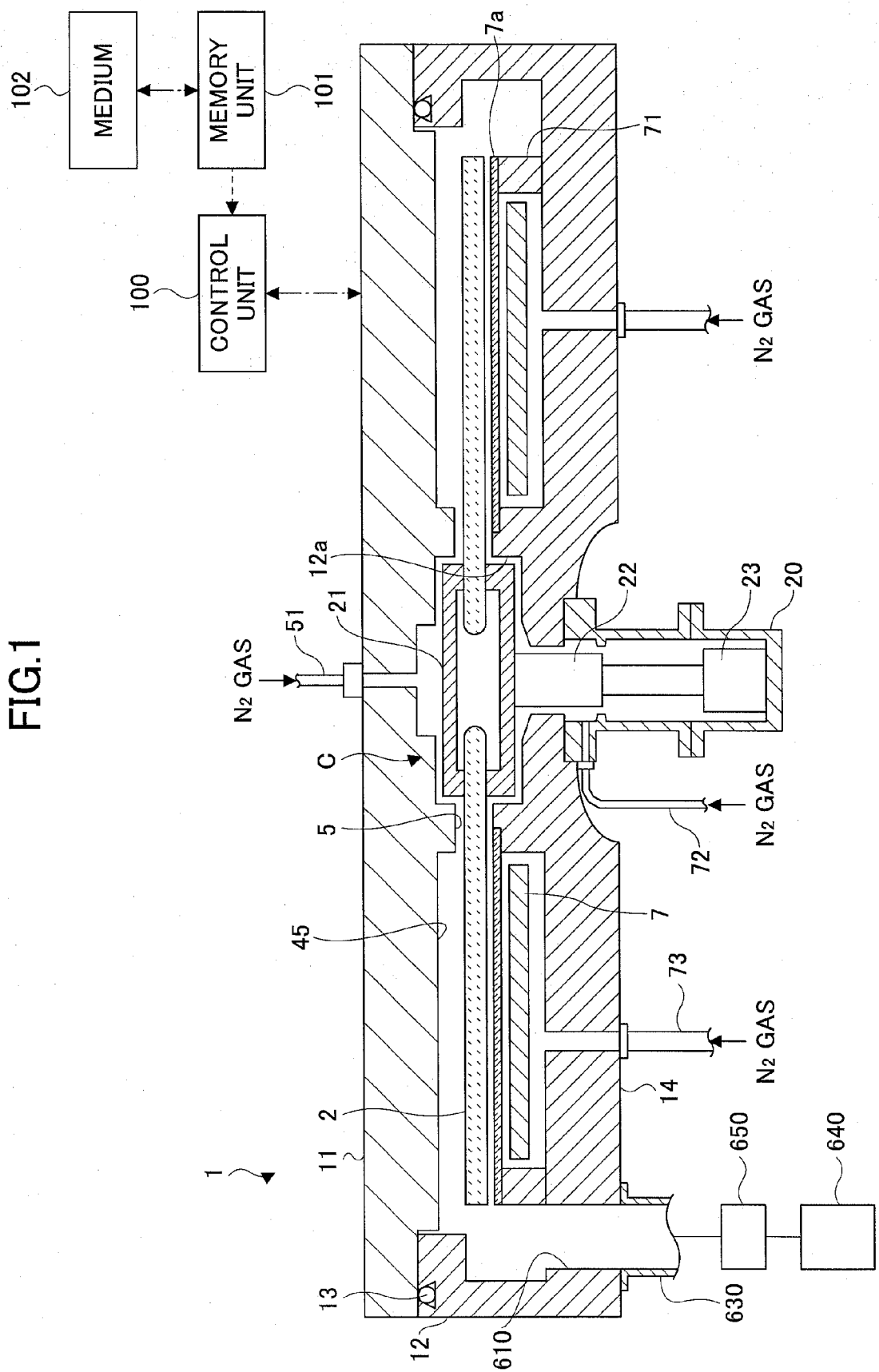
FIG. 1 is a cross-sectional view for illustrating an example of a film deposition apparatus preferable for performing a method of manufacturing a silicon dioxide film according to an embodiment of the present invention.

A description is given below, with reference to accompanying drawings of non-limiting, exemplary embodiments of the present invention. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

[Film Deposition Apparatus]

To begin with, a description is given below of a film deposition apparatus preferable for performing a method of manufacturing a silicon oxide film of an embodiment of the present invention.

Figure 2:
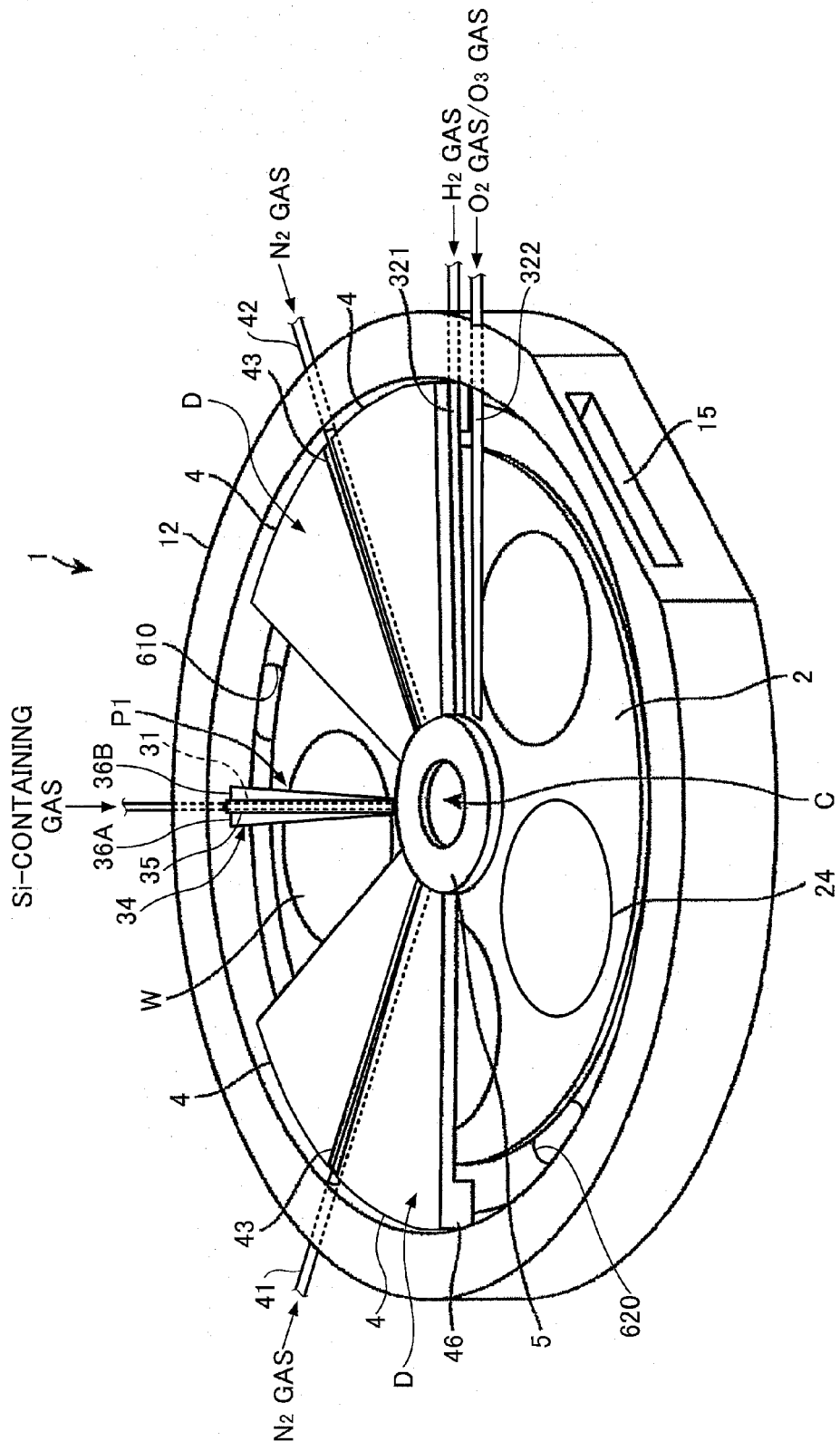
FIG. 2 is a perspective view for illustrating a structure of an inside of a vacuum chamber of the film deposition apparatus in FIG. 1.
Figure 3:
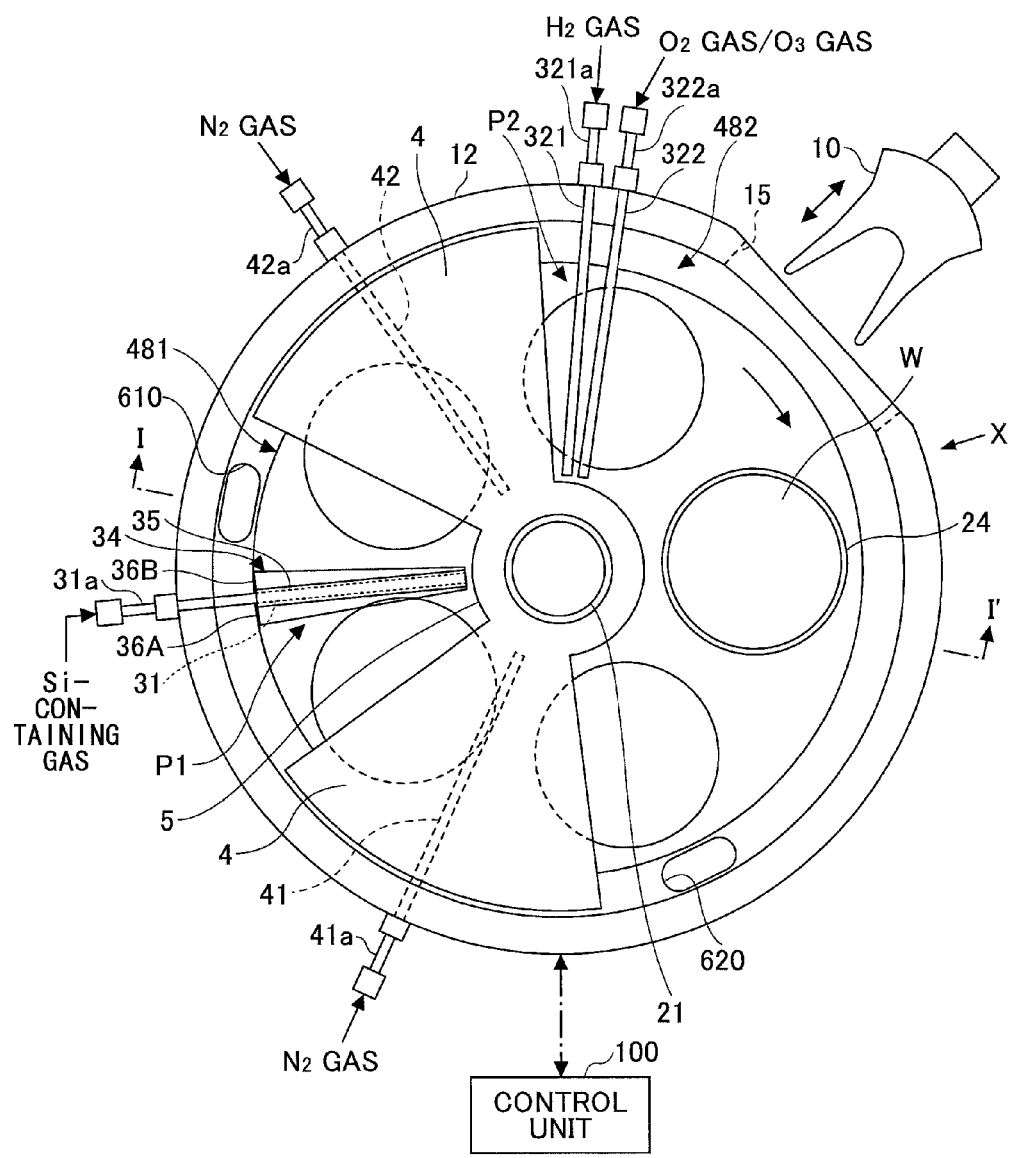
FIG. 3 is a schematic plan view for illustrating the structure of the inside of the vacuum chamber of the film deposition apparatus in FIG. 1.

FIG. 1 is a cross-sectional view of an exemplary film deposition apparatus preferable for performing a method of manufacturing a silicon oxide film of an embodiment of the present invention. FIG. 2 is a perspective view of the exemplary film deposition apparatus suitable for performing the method of manufacturing the silicon oxide film of the embodiment. FIG. 3 is a schematic plan view for illustrating the exemplary film deposition apparatus preferable for performing the method of manufacturing the silicon oxide film of the embodiment of the present invention.

Referring to FIGS. 1 to 3, the film deposition apparatus of the embodiment includes a chamber 1 having a substantially circular shape in its plan view and a flattened shape in its side view, and a turntable 2 having its rotational center in the center of the chamber 1. The chamber 1 includes a chamber body 12 having a bottomed cylindrical shape, and a ceiling plate 11, which is detachably provided on the upper surface of the chamber body 12 through a sealing member 13 (see FIG. 1) such as an O-ring to hermetically seal the chamber 1.

The turntable 2 is fixed by a core portion 21 in a cylindrical shape at the center portion of the turntable 2. The core unit 21 is fixed to the upper end of a rotational shaft 22 extending in the vertical direction. The rotational shaft 22 penetrates through a bottom portion 14 of the chamber 1. The lower end of the rotational shaft 22 is attached to a drive part 23, which causes the rotational shaft 22 (see FIG. 1) to rotate around the vertical axis of the rotational shaft 22. The rotational shaft 22 and the drive part 23 are accommodated in a cylindrical case body 20 whose upper surface is opened. A flange on the upper surface of the case body 20 is hermetically attached to the lower surface of a bottom portion 14 of the chamber 1 to maintain a gastight state between the inner atmosphere and the outer atmosphere of the case body 20.

Referring to FIG. 2 and FIG. 3, circular concave portions 24 for receiving a plurality of semiconductor wafers (five wafers are illustrated in FIGS. 2 and 3) are formed in a surface of the turntable 2 along a rotational direction (a circumferential direction) of the turntable 2. FIG. 3 illustrates a state where the wafer W is placed on only one circular concave portion 24 for the sake of convenience. The inner diameter of the circular concave portion 24 is slightly greater than the diameter of the wafer W by, for example, 4 mm. The depth of the circular concave portion 24 is substantially equal to the thickness of the wafer W or slightly deeper than the thickness of the wafer W. Accordingly, when the wafer W is accommodated in the circular concave portion 24, the height of the surface of the wafer W is approximately the same as the height of the surface of the turntable in an area where the wafer is not placed or slightly lower than the height of the surface of the turntable 2.

FIGS. 2 and 3 are diagrams illustrating the structure inside the chamber 1. For the sake of convenience, the ceiling plate 11 is omitted from illustration in FIGS. 2 and 3. As illustrated in FIGS. 2 and 3, a first gas nozzle 31, second gas nozzles 321 and 322, and separation gas nozzles 41 and 42, which are made of, for example, quartz, are arranged above the turntable 2 while interposing gaps in a circumferential direction of the chamber (a rotational direction along an arrow A in FIG. 3 of the turntable 2). In FIGS. 2 and 3, the separation gas nozzle 41, the first gas nozzle 31, the separation gas nozzle 42, and the second gas nozzles 321 and 322 are arranged in this order in a clockwise direction (the rotational direction of the turntable 2) from a transfer opening 15 described below. These nozzles 31, 321, 322, 41, and 42 are attached to the chamber body 12 by fixing gas introducing ports 31a, 321a, 322a, 41a and 42a (see FIG. 3), which are base portions of the nozzles 31, 321, 322, 41 and 42, respectively, to the outer peripheral wall of the chamber 1 so as to horizontally extend along a radial direction of the chamber body 12. Thus, these nozzles 31, 32, 41 and 42 are introduced inside the chamber 1 from the outer peripheral wall of the chamber 1.

In the method of manufacturing the silicon oxide film of the embodiment, hydrogen gas and an oxidation gas can be used as the second gas. For example, a gas containing oxygen gas and/or ozone gas is preferred to be used as the oxidation gas. Because of this, as illustrated in FIGS. 2 and 3, two of the second gas nozzles 321 and 322 are arranged, and can be configured to supply the hydrogen gas from one second gas nozzle 321 and to supply oxygen gas and/or ozone gas from the other second gas nozzle 322. In this case, the second gas nozzle 321 is the second gas nozzle for supplying hydrogen gas, and the other second gas nozzle 322 is the second gas nozzle for supplying the oxidation gas. On this occasion, either the nozzle supplying hydrogen gas or the nozzle supplying oxygen gas and/or ozone gas may be arranged on the upstream side in the rotational direction of the turntable. That is to say, oxygen gas and/or ozone gas may be supplied from the second gas nozzle 321 and hydrogen gas may be supplied from the other second gas nozzle 322. In this manner, when providing two of the second gas nozzles 321 and 322, the second gas nozzles 321 and 322 are preferred to be arranged adjacent to and in parallel with each other as illustrated in FIGS. 2 and 3, but are not limited to such a form. For example, the second gas nozzles 321 and 322 may be arranged apart from each other.

Moreover, by preliminarily mixing hydrogen gas with oxygen gas and/or ozone gas, the second gas nozzle may be constituted of a single nozzle to supply the mixed gas.

Here, when an area of a second process area P2 described later is large, a plurality of pairs of the second gas nozzles may be provided to supply a sufficient amount of the second gas into the second process area P2. For example, additional second gas nozzles 321 and 322 can be installed at any location on the downstream side in the rotational direction of the turntable in addition to the second gas nozzles 321 and 322 provided on the most upstream side in the rotational direction of the turntable 2 within the second process area P2. More specifically, for example, another pair of second gas nozzles 321 and 322 can be provided at a location X illustrated in FIG. 3, which is in the middle part in the rotational direction of the turntable within the second process area P2. In this case, the additional pair of second gas nozzles can be also introduced from the outer wall of the vacuum chamber 1 into the inside of the vacuum chamber 1 by fixing gas introduction ports thereof to the outer wall of the chamber body 12 as well as the other gas nozzles.

A first gas supply source containing the first gas is connected to the first gas nozzle 31 through an open/close valve and a flow controller (both of which are not shown in the drawing). Also, second gas supply sources containing the second gases are connected to the second gas nozzles 321 and 322 through open/close valves and flow controllers (both of which are not shown in the drawing), respectively.

Here, a silicon-containing gas can be preferably used as the first gas. Although the silicon-containing gas is not limited to a specific gas, for example, an aminosilane-based gas such as 3DMAS (Tris(dimethylamino) silane $Si(N(CH_3)_2)_3H$), 4DMAS (Tetrakis(dimethylamino)silane $Si(N(CH_3)_2)_4$), TCS (tetrachlorosilane $SiCl_4$), DCS (dichlorosilane SiH$_2$Cl$_2$), SiH$_4$ (monosilane), HCD (hexachlorodisilane Si$_2$Cl$_6$) or the like is preferably used as the first gas. As described above, hydrogen gas and an oxidation gas are preferably used as the second gas, and oxygen gas and/or ozone gas are preferable used as the oxidation gas. The oxidation gas is preferred to contain ozone gas, by which a dense silicon oxide film can be particularly obtained.

In addition, the separation gas nozzles 41 and 42 are connected to a supply source (not illustrated) of a separation gas through a pipe arrangement, a flow controller, or the like (not illustrated). The separation gas may be an inert gas such as a noble gas of helium (He), Argon (Ar) or the like or an inert gas such as nitrogen (N$_2$) gas or the like. Although the inert gas is not limited to a particular gas and the noble gas, N$_2$ gas or the like can be used, and for example, N$_2$ gas can be preferably used.

A plurality of gas discharge holes 33 opening toward the turntable 2 are arranged in the first gas nozzle 31 and the second gas nozzles 321 and 322 along the longitudinal directions of the first gas nozzle 31 and the second gas nozzles 321 and 322. Although the arrangement of the gas discharge holes 33 is not limited to a particular arrangement, for example, the gas discharge holes 33 can be arranged at an interval of, for example, 10 mm. In an area below the first gas nozzle 31, there is a first process area P1 used to cause the first gas to adsorb on the wafer W. The lower area of the second gas nozzles 321 and 322 is a second process area P2 where the first gas adsorbing on the wafer W in the first process area P1 is oxidized.

Figure 4A:
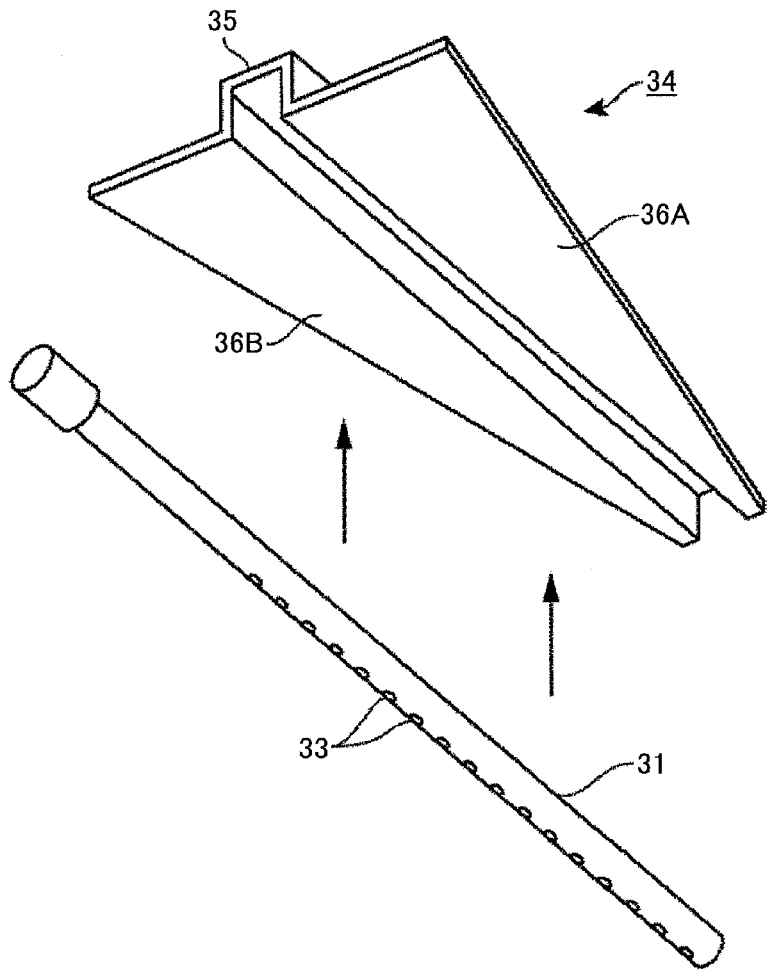
FIGS. 4A and 4B are configuration diagrams illustrating a gas nozzle and a nozzle cover of the film deposition apparatus in FIG. 1.

As illustrated in FIGS. 2 and 3, a nozzle cover is preferred to be provided at the first gas nozzle 31. A description is given below of the nozzle cover 34 with reference to FIGS. 4A and 4B. The nozzle cover 34 extends along a lengthwise direction of the first gas nozzle 31 and has a base part 35 having a convex cross-sectional shape. The base part 35 is arranged to cover the first gas nozzle 31. A current plate 36A is attached to a lower end of one side wall extending along the lengthwise direction of the base part 35 and a current plate 36B is attached to a lower end of the other side wall. In the embodiment, as illustrated FIGS. 2 and 3, the current plate 36A is arranged on the upstream side of the first gas nozzle in the rotational direction of the turntable 2, and the current plate 36B is arranged on the downstream side.

Figure 4B:
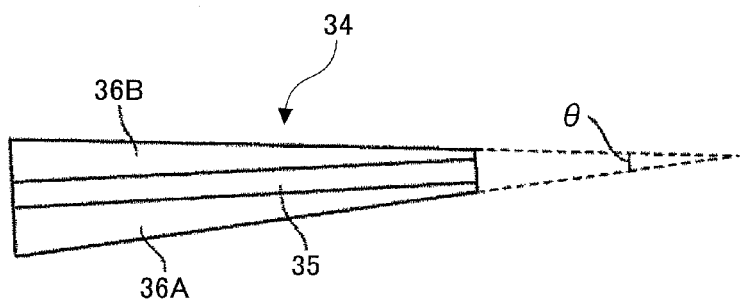

As clearly illustrated in FIG. 4B, the current plates 36A and 36B are symmetrically formed with respect to the central axis of the first gas nozzle 31. Moreover, length of the current plates 36A and 36B along the rotational direction of the turntable 2 increases with decreasing distance to the outer periphery of the turntable 2, and therefore, the nozzle cover 34 has an approximately sectorial planar shape. Here, although an angle θ of the sector illustrated by a dashed line in FIG. 4B is determined by also considering a size of a convex portion 4 (separation area D) described later, for example, the angle is preferred to be in a range from 5 degrees to less than 90 degrees, and more specifically, is further preferred to be in a range from 8 degrees to less than 10 degrees.

Here, in the embodiment, an example of providing the nozzle cover 34 at only at the first gas nozzle 31 is illustrated, but a similar nozzle cover may be provided at the second gas nozzles 321 and 322.

Referring to FIGS. 2 and 3, two convex portions 4 are provided inside the chamber 1. Each convex portion 4 has a substantially sector form in its plan view with its apex cut in a circular arc shape. In this embodiment, an inner circular arc is connected to a ring-shaped protruding portion 5 (described later), and an outer circular arc is arranged along an inner peripheral surface of the chamber body 12 of the chamber 1.

Figure 5:
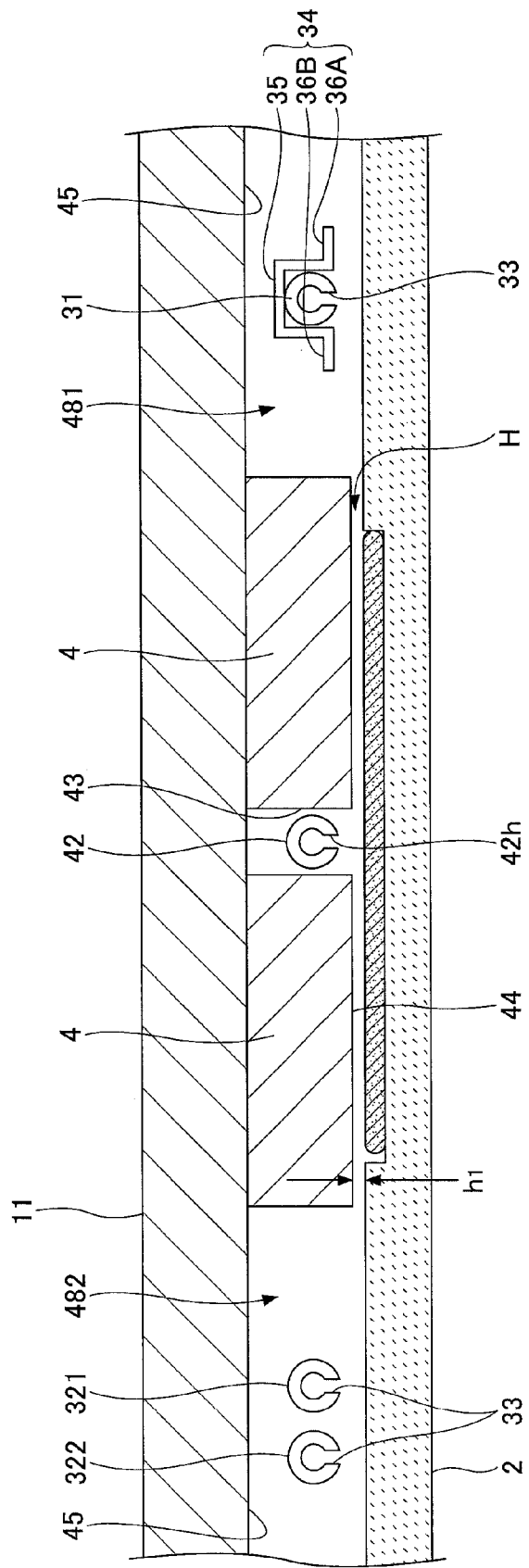
FIG. 5 is a partial cross-sectional view of the film deposition apparatus in FIG. 1.

FIG. 5 illustrates a cross section of the chamber 1 along a concentric circle of the turntable 2 from the gas nozzle 31 to the gas nozzles 321 and 322. As illustrated, a convex portion 4 is attached to the back surface of the ceiling plate 11. There are a low ceiling surface 44 (a first ceiling surface), which is a lower surface of the convex portion 4, and a high ceiling surface 45 (a second ceiling surface), which is a higher surface of the convex portion 4 and is positioned on both sides of the low ceiling surface 44 in a circumferential direction.

Furthermore, as illustrated in FIG. 5, a groove portion 43 is formed in the middle of the convex portion 4 in its circumferential direction so as to extend along a radial direction. The separation gas nozzle 42 is accommodated inside the groove portion 43. Another groove portion 43 is similarly formed in another convex portion 4. The separation gas nozzle 41 is accommodated in the other groove portion 43. Here, one of gas discharge holes 42h formed in the separation gas nozzle 42 is illustrated in FIG. 5. The plurality of gas discharge holes 42h are formed along the longitudinal direction of the separation gas nozzle 42 at a predetermined interval (e.g., 10 mm). Moreover, an opening size of the gas discharge holes 42h can be made, for example, 0.3 to 1.0 mm. Although they are not illustrated in the drawing, gas discharge holes can be formed in the separation gas nozzle 41 similarly to the gas nozzle 42.

The first gas nozzle 31 and the second gas nozzles 321 and 322 are provided in spaces under the high ceiling surface 45. The first and second gas nozzles 31, 321 and 322 are provided in the vicinity of the wafer W and apart from the ceiling surface 45. In addition, FIG. 5 illustrates a space 481 under the ceiling surface 45 where the first gas nozzle 31 is provided and a space 482 under the ceiling surface 45 where the second gas nozzles 321 and 322 are provided.

A separation space H, which is narrow, is formed between the low ceiling surface 44 and the turntable 2. When an inactive gas, for example, N$_2$ gas, is supplied from the separation gas nozzle 42, N$_2$ gas flows toward the spaces 481 and 482 through the separation space H. At this time, because the volume of the separation space H is smaller than the volumes of the spaces 481 and 482, the pressure of the separation space H can be set relatively higher than the pressures in the spaces 481 and 482 by N$_2$ gas. In other words, the separation space H provides a pressure blocking wall having a high pressure between the spaces 481 and 482. Moreover, N$_2$ gas flowing from the separation space H to the spaces 481 and 482 functions as counter flows against the first gas from the first flow area P1 and the second gas from the second process area P2. Accordingly, the first gas from the first flow area P1 and the second gas from the second process area P2 are separated by the separation space H. Therefore, it is possible to prevent the first gas from the first process area P1 and the second gas from the second process area P2 from mixing and reacting with each other inside the chamber 1.

Here, it is preferable to set the height h1 of the ceiling surface 44 relative to the upper surface of the turntable 2 suitable to make the pressure in the separation space H higher than the pressures in the spaces 481 and 482, considering the pressure inside the chamber 1 during the film deposition, the rotational speed of the turntable 2, the supply amount of the separation gas (the N$_2$ gas), or the like.

With reference to FIGS. 1 through 3 again, a ring-shaped protruding portion 5 surrounding the outer periphery of the core portion 21 holding the turntable 2, is provided under the lower surface of the ceiling plate 11. The ring-shaped protruding portion 5 is continuously formed from the convex portions 4 at portions on a side of the rotational center of the convex portions 4. The lower surface of the ring-shaped protruding portion 5 has substantially the same height as that of the ceiling surface 44.

Figure 6:
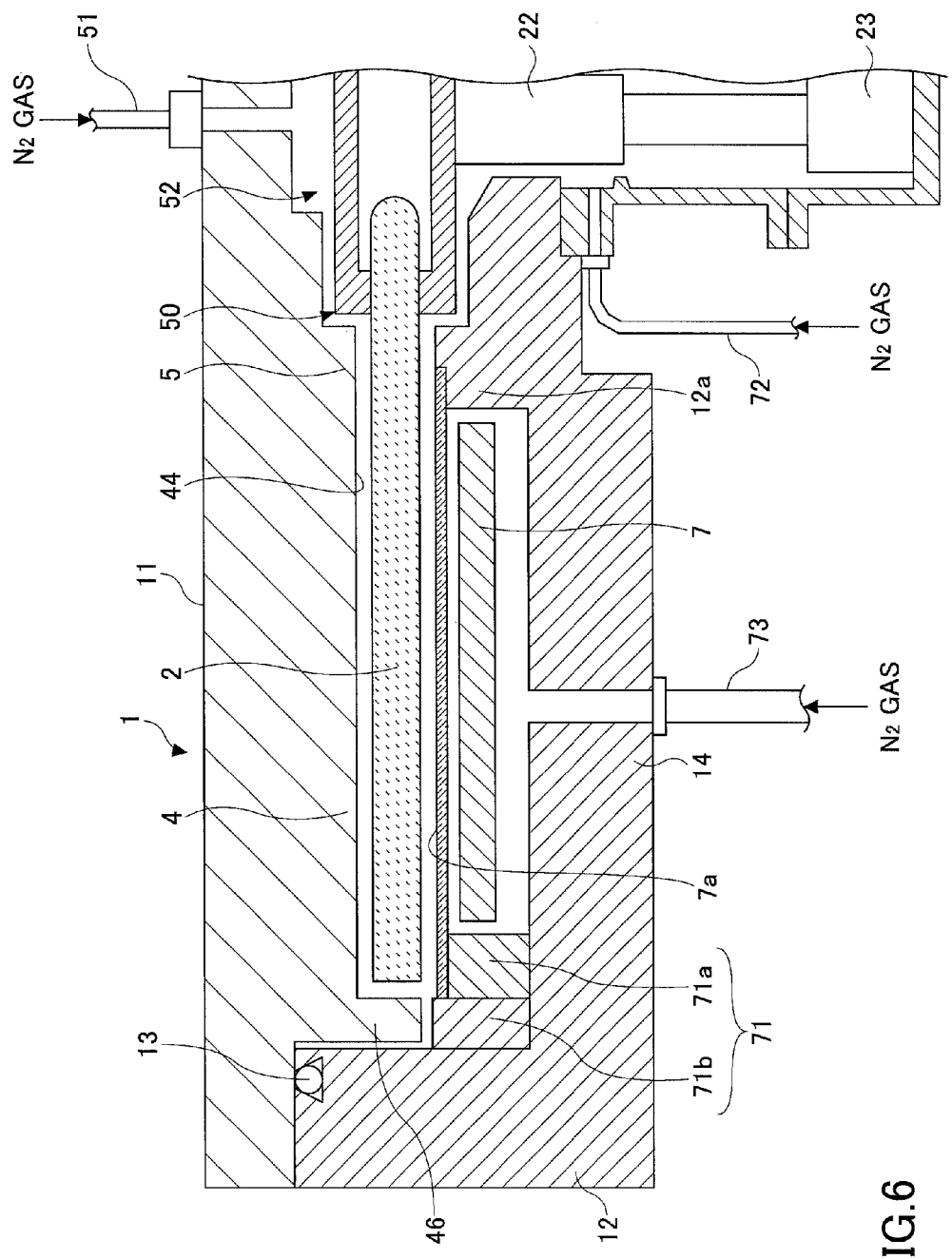
FIG. 6 is another partial cross-sectional view of the film deposition apparatus in FIG. 1.

FIG. 1 formerly referred to is a cross-sectional view taken along a line I-I' of FIG. 3, and illustrates an area where the ceiling surface 45 is provided. On the other hand, FIG. 6 is a partial cross-sectional view illustrating an area including the ceiling surface 44 of the film deposition apparatus 1. As illustrated in FIG. 6, a bent portion 46 bent in a L-like shape so as to face the outer end surface of the turntable 2 can be formed in a peripheral edge portion (a portion of the chamber 1 on the outer edge side) of the convex portion 4 shaped into a substantially sectorial form. The bent portion 46 can prevent gases from circulating between the spaces 481 and 482 through a space between the turntable 2 and the inner periphery of the chamber body 12. The convex portion 4 shaped into the substantially sector form is provided on the ceiling plate 11. Because the ceiling plate 11 is detachable from the chamber body 12, there is a small clearance between the outer peripheral surface of the bent portion 46 and the chamber body 12. A clearance between the inner peripheral surface of the bent portion 46 and the outer edge surface of the turntable 2 and a clearance between the outer peripheral surface of the bent portion 46 and the chamber body 12 are set to have a dimension similar to, for example, that of a clearance between the ceiling surface 44 and the upper surface of the turntable 2.

Referring to FIG. 3 again, a first evacuation opening 610 in communication with the space 481 and a second evacuation opening 620 in communication with the space 482 are formed between the turntable 2 and the inner periphery of the chamber body 12. As illustrated in FIG. 1, the first and second evacuation ports 610 and 620 are connected to, for example, a vacuum pump 640 that is an evacuating unit through exhaust pipes 630. FIG. 1 also illustrates a pressure control unit 650.

As illustrated in FIGS. 1 and 6, a heater unit 7 that is a heating means can be provided in a space between the turntable 2 and the bottom portion 14 of the chamber 1, thereby heating the wafer W on the turntable 2 up to a temperature determined in a process recipe (for example, 610° C.) through the turntable 2. A ring-like cover member 71 is provided around the periphery and on the lower side of the turntable 2 to prevent the gas from intruding into a lower area under the turntable 2. As illustrated in FIG. 6, the cover member 71 can be configured to include an inner member 71a provided in a position vertically corresponding to the outer edge portion of the turntable 2 and to an outer peripheral side outside the outer edge portion of the turntable 2, and an outer member 71b provided between the inner member 71a and the inner wall surface of the chamber 1. The outer member 71b is provided in the vicinity of the bent portion 46 formed on the outer edge portion of the convex portion 4 in the separation areas D under the bent portions 46. The inner member 71a surrounds the entire periphery of the heater unit 7 and is positioned under the outer edge portion of the turntable 2 and a portion slightly outside the outer edge portion.

As illustrated in FIG. 1, a part of the bottom portion 14 closer to the rotation center than the space where the heater unit 7 is arranged has the ring-shaped protruding portion 12a protruding upward so as to approach the core portion 21 provided on the lower surface of the turntable 2 and in the vicinity of the center portion of the turntable 2. A narrow space is provided between the ring-shaped protruding portion 12a and the core portion 21. A clearance between the inner peripheral surface of a through-hole for the rotational shaft 22 penetrating through the bottom portion 14 and the rotational shaft 22 is small. The narrow space and the small clearance communicate with the inside of the casing 20. A purge gas supply pipe 72 is provided in the case body 20 so that the $N_2$ gas that is the purge gas is supplied into the narrow space to purge the narrow space. In the bottom portion 14 of the chamber 1, a plurality of purge gas supply pipes 73 are provided under the heater unit 7 at intervals of a predetermined angle in the circumferential direction (only one purge gas supply pipe 73 is illustrated in FIG. 6) to purge a space where the heater unit 7 is arranged. Furthermore, a lid member 7a is provided between the heater unit 7 and the turntable 2 to bridge and cover a clearance between the inner peripheral wall of the outer member 71b (the upper surface of the inner member 71a) and the upper end portion of the ring-shaped protruding portion 12a along the circumferential direction in order to prevent the gas from intruding into an area in which the heater unit 7 is provided. The lid member 7a can be made of, for example, quartz.

When $N_2$ gas is supplied from the purge gas supply pipe 72, $N_2$ gas flows through a space between the turntable 2 and the lid member 7a by way of a clearance between the inner periphery of the through-hole and the rotational shaft 22 and a clearance between the protruding portion 12a and the core portion 21, and evacuated from the first evacuation opening 610 or the second evacuation opening 620 (see FIG. 3). Moreover, when $N_2$ gas is supplied from the purge gas supply pipes 73, $N_2$ gas flows out of the space in which the heater unit 7 is accommodated through a clearance between the lid member 7a and the inner member 71a (not illustrated in the drawing), and is evacuated from the first evacuation opening 610 or the second evacuation opening 620 (see FIG. 3). The flow of $N_2$ gas can prevent the gases in the space 481 and the space 482 mixing with each other through a space on the central and lower side of the vacuum chamber 1 and a space below the turntable 2.

Moreover, a separation gas supply tube 51 is connected to a center portion of the ceiling plate 11 of the chamber 1. The separation gas of $N_2$ gas is supplied to a space 52 between the ceiling plate 11 and the core portion 21. The separation gas supplied to the space 52 is discharged toward the periphery of the turntable 2 along the surface on the side of a wafer receiving area of the turntable 2 through a narrow clearance 50 (see FIG. 6) between the ring-shaped protruding portion 5 and the turntable 2. The space 50 is maintained to have a pressure higher than those of the spaces 481 and 482 by the separation gas. Therefore, the space 50 prevents the first gas supplied to the first process area P1 and the second gas supplied to the second process area P2 from being mixed with each other after passing through the center area C. That is to say, the space 50 (or the center area C) functions in a manner similar to the separation space H (or the separation area D).

Furthermore, as illustrated in FIGS. 2 and 3, a transfer opening 15 can be formed in the side wall of the chamber 1 for transferring the wafer W, which is the substrate, between a transfer arm 10 provided outside the chamber 1 and the turntable 2. The transfer opening 15 is opened and closed by a gate valve (not illustrated in the drawing). In this case, the wafer W is transferred between the circular concave portion 24 that is the wafer receiving area of the turntable 2 and the transfer arm 10 at a position facing the transfer opening 15. For this purpose, a lift pin (not illustrated in the drawing) for lifting the wafer W from the back surface side to serve and receive the wafer W and a lifting mechanism (not illustrated in the drawing) for lifting the lift pin (not illustrated in the drawing) can be provided at a portion of the turntable 2 corresponding to the position where the wafer W is served and received. The lift pin penetrates through the circular concave portion 24 of the turntable 2.

Moreover, as illustrated in FIG. 1, the film deposition apparatus according to the embodiment may include a control unit 100 constituted of a computer for controlling operations of the entire film deposition apparatus. A program to be executed by the film deposition apparatus under control of the control unit 100 can be stored in a memory of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 by a predetermined reading device and can be installed inside the control unit 100.

[Method of Manufacturing a Silicon Oxide Film]

Next, a description is given below of a method of manufacturing a silicon oxide film according to an embodiment of the present invention.

When implementing the method of manufacturing the silicon oxide film according to the embodiment, a film deposition apparatus can be preferably used that includes a rotatable turntable accommodated in a vacuum chamber, a first gas supply part for supplying a first gas, and a second gas supply part for supplying a second gas.

In such a film deposition apparatus, the turntable can include a receiving part to receive a plurality of substrates (wafers) in its upper surface. The first gas supply part is arranged in a first process area that is divided above an upper surface and can supply the first gas onto the upper surface of the turntable. Moreover, the second gas supply part is arranged in a second process area apart from the first process area along a circumferential direction of the turntable and can supply the second gas onto the upper surface of the turntable. More specifically, for example, the above-mentioned film deposition apparatus can be preferably used to implement the method manufacturing the silicon oxide film according to the embodiment.

Furthermore, the method of manufacturing the silicon oxide film of the embodiment may continuously supply a silicon-containing gas, which is the first gas, from the first gas supply part, and continuously supply hydrogen gas and an oxygen gas, which are the second gases, from the second gas supply part.

In addition, the method of manufacturing the silicon oxide film of the embodiment preferably includes an adsorption step and a reaction step. Here, the adsorption step can be made a step of causing the first gas to adsorb on a surface of a wafer placed on the turntable in the first process area while rotating the turntable. Also, the reaction step can be made a step of causing the first gas adsorbing on the surface of the wafer to react with the second gas supplied in the second process area while rotating the turntable.

A description is given below of the above-mentioned method of manufacturing the silicon oxide film by taking an example of implementing the method by using the film deposition apparatus discussed above.

To begin with, a gate valve (not illustrated in the drawing) is opened, and the wafer W is transferred into the circular concave portion 24 of the turntable 2 through the transfer opening 15 (see FIG. 3) from the outside by the transfer arm (see FIG. 3). The transfer is performed by causing the not illustrated lift pin to move up and down from the bottom side of the chamber 1 through the through-hole formed in the bottom surface of the circular concave portion 24 when the circular concave portion 24 stops at a position facing the transfer opening 15. Such transfer of the wafer W is performed by intermittently rotating the turntable 2, and the wafers W are placed on five of the circular concave portions 24 of the turntable 2, respectively.

Subsequently, the gate valve is closed, and after evacuating the chamber 1 up to a maximum degree of vacuum reachable by the vacuum pump 640, $N_2$ gas is discharged at a predetermined flow rate from the separation gas nozzles 41 and 42. Moreover, an $N_2$ gas is also discharged from the separation gas supply pipe 51 and the purge gas supply pipes 72 at a predetermined flow rate. Following this, the pressure control unit 650 (see FIG. 1) adjusts the pressure in the chamber 1 to a preset process pressure.

Next, the turntable 2 is rotated in a clockwise direction. When rotating the turntable 2, although the rotational speed of the turntable 2 is not particularly limited, the rotational speed of the turntable 2 is preferably set in a range from 5 to 240 rpm. This is because the second gas supplied to the second process area P2 can sufficiently react with the first gas adsorbed on the wafers W and a dense silicon oxide film having excellent film quality can be manufactured by setting the rotational speed of the turntable 2 at 240 rpm or lower. Moreover, by setting the rotational speed of the turntable 2 at 5 rpm or higher, the silicon oxide film can be manufactured, maintaining preferable productivity. In terms of the improvement of productivity and the enhancement of film quality of the silicon oxide film, the rotational speed of the turntable 2 is more preferred to set in a range from 20 to 120 rpm.

Furthermore, in the method of manufacturing the silicon oxide film of the embodiment, hydrogen gas and oxygen gas contained in the second gas supplied to the second process area P2 are preferred to react with each other and to generate an OH. (hydroxyl radical) and/or an O. (oxygen radical). Because the OH. has particularly strong oxidizing power, the OH. can notably promote an oxidation reaction compared to a case of just supplying an oxidation gas and oxidizing a material adsorbing on surfaces of wafers. Accordingly, the method of manufacturing the silicon oxide film of the embodiment can certainly promote the oxidation of the first gas adsorbed on the surfaces of the wafers W, and can form a silicon oxide film having a uniform film property and a low film contraction percentage even when a heating process is performed.

Therefore, the wafers W are preferred to be heated by the heater unit 7 when rotating the turntable 2 so as to promote the reaction between hydrogen gas and an oxidation gas contained in the second gas and the reaction to generate hydroxyl radicals and the like. Although a temperature at this time is not particularly limited, it is preferable to heat the temperature up to a temperature that generates sufficient OH. (hydroxyl radicals) and O. (oxygen radicals) before the second gas reaches the surface of the wafers W. More specifically, for example, it is preferable to heat the wafers W, which are substrates, up to a temperature in a range from 400 to 900 degrees C.

Here, oxygen gas and/or ozone gas can be preferably used as the oxidation gas. In particular, the oxygen gas is further preferred to contain ozone gas because ozone gas can sufficiently promote the oxidation reaction, thereby obtaining a dense silicon oxide film. When the oxidation gas contains ozone gas, it is preferable to heat the oxidation gas to a temperature in a range from 400 to 700 degrees C. to prevent decomposition of ozone gas. In particular, in terms of promoting the generation reaction of hydroxyl radicals and/or oxygen radicals and preventing the decomposition of the second gas, the wafers W are preferably heated in a range from 450 to 680 degrees C. The heating of the wafers W by the heater unit 7 is preferably performed continuously after starting the rotation of the turntable 2 and until ending the film deposition of the silicon oxide film on the wafers W. In particular, the heating of the wafers W by the heater unit 7 is preferably performed continuously after installing the wafers W into the film deposition apparatus and until carrying the wafers W out of the film deposition apparatus.

As discussed above, after starting the rotation of the turntable 2, the first gas is supplied from the first gas nozzle 31, which is the first gas supply part, to the vacuum chamber 1. At this time, the second gases are supplied from the second gas nozzles 321 and 322, which are the second gas supply part, to the vacuum chamber 1. In other words, the first gas and the second gases are started to be supplied at the same time, and can be continuously supplied until ending the film deposition of the silicon oxide film.

A silicon-containing gas can be used as the first gas, and hydrogen gas and an oxidation gas can be used as the second gases. As described above, oxygen gas and/or ozone gas can be preferably used as the second gases. Although the silicon-containing gas used as the first gas is not particularly limited, as described above, an aminosilane-based gas such as 3DMAS (Tris(dimethylamino)silane $Si(N(CH_3)_2)_3H$), 4DMAS (Tetrakis(dimethylamino)silane $Si(N(CH_3)_2)_4$), TCS (tetrachlorosilane $SiCl_4$), DCS (dichlorosilane $SiH_2Cl_2$), $SiH_4$ (monosilane), HCD (hexachlorodisilane $Si_2Cl_6$) or the like is preferably used as the first gas.

The second gas supply part includes two of the second gas nozzles. One of the second gas nozzles (a second gas nozzle for supplying hydrogen gas) can supply hydrogen gas, and the other of the second gas nozzles (a second gas nozzle for supplying an oxidation gas) can supply an oxidation gas, respectively. Moreover, the second gas supply part can be configured to include a single second gas nozzle and supply preliminarily mixed hydrogen gas and the oxidation gas from the single second gas nozzle.

Furthermore, as described above, a plurality of second gas supply parts can be installed at a plurality of locations in the second process area P2. In other words, a plurality of pairs of the second gas nozzles can be provided. Although the installation positions of the second gas supply parts are not particularly limited, more specifically, for example, within the second process area P2, the second gas supply parts can be installed at the position on the upstream side in the rotational direction of the turntable and the position illustrated by X in FIG. 3, which is the central position of the second process area P2 in the circumferential direction of the turntable 2.

Supply conditions of the silicon-containing gas supplied from the first gas nozzle 31 are not particularly limited, and can be arbitrarily selected to be able to cause the first gas to adsorb on the surface of the wafers W when the wafers W rotated by the turntable 2 pass through the first process area P1. For example, a supply flow rate of the first gas is preferably set at 0.1 L/min or higher, and further preferably set at 0.3 L/min or higher. Also, a pressure of the first gas within the first process area P1 is preferably set at 200 Pa or higher, and further preferably set at 500 Pa or higher.

Supply conditions of the second gas supplied from the second gas nozzles 321 and 322 are not limited either, and can be arbitrarily selected to be able to sufficiently oxidize the first gas adsorbed on the surfaces of the wafers W.

For example, a supply flow rate of hydrogen gas contained in the second gas is preferably set at 0.5 L/min or higher in order to generate sufficient hydroxyl radicals and the like from the second gas supplied to the second process area P2. In particular, the supply flow rate of hydrogen gas is further preferably set at 0.75 L/min or higher.

In addition, a supply ratio of hydrogen gas to oxygen gas and/or ozone gas, which are the second gases, is not particularly limited, and can be selected depending on a degree of the film contraction percentage required for the deposited silicon oxide film. For example, when a supply per unit time of the total second gas is made one, hydrogen gas is preferably supplied so that a supply ratio of hydrogen gas to the total second gas (which is hereinafter expressed as "a supply ratio of hydrogen gas"), that is to say, $[H_2]/([H_2]+[O_2]+[O_3])$, is set in a range from 0.1 to 0.6. Here, the $[H_2]$ in the above formula shows a hydrogen gas supply within the second gas supplied per unit time. The $[O_2]$ and $[O_3]$ similarly show supplies of oxygen gas and ozone gas within the second gas supplied per unit time, respectively. By supplying hydrogen gas so as to be such a ratio, sufficient hydroxyl radicals and the like can be generated and the oxidation reaction of the first gas adsorbed on the surfaces of the wafers W can be efficiently promoted. Moreover, hydrogen gas is preferably supplied so that a supply ratio of hydrogen gas to the total second gas is in a range from 0.2 to 0.5 in order to particularly prevent the film contraction percentage of the deposited silicon oxide film.

The pressure of the second gas within the second process area P2 is not particularly limited, but is preferably selected to be able to sufficiently oxidize the first gas adsorbed on the surfaces of the wafers W when the wafers W placed on the turntable 2 pass through the second process area P2. More specifically, for example, the pressure of the second gas within the second process area P2 is preferably set, for example, in a range from 0.5 kPa to 1.3 kPa, further preferably set in a range from 0.67 kPa to 1.0 kPa.

Here, as described above, in the film deposition apparatus of the embodiment, the separation gas supply parts that supply the separation gas to the surface of the turntable 2, that is to say, the separation gas nozzles 41 and 42, are arranged between the first process area P1 and the second process area P2 within the vacuum chamber 1. Furthermore, the separation areas D including the ceiling surfaces 44 forming the narrow spaces (separation spaces H) that guide the separation gas from the separation gas supply parts to the first process area P1 and the second process area P2 with the upper surface of the turntable 2 are arranged. Here, the ceiling surfaces 44 can be formed so as to increase their length of arcs along the circumferential direction of the turntable 2 with increasing distance from the center of the turntable 2 toward the outer periphery (which means a sectorial shape). Due to this, the separation spaces H (see FIG. 5) separate the first process area P1 and the second process area P2 by supplying the separation gas from the separation gas supply parts while rotating the turntable 2, thereby preventing the first gas and the second gas from mixing with each other within the vacuum chamber 1.

As discussed above, by placing the wafers W on the turntable 2 and rotating the turntable 2 while supplying the first gas and the second gas continuously, when the wafers W pass through the first process area P1 by the rotation of the turntable 2, the adsorption step of causing the first gas to adsorb on the surfaces of the wafers W is implemented. Next, when the wafers W pass through the second process area P2, the reaction step of causing the first gas adsorbed on the surfaces of the wafers W to react with the second gas supplied to the second process area P2 is implemented. This causes a silicon oxide film to be deposited on the surfaces of the wafers W.

At this time, because the first gas and the second gas are supplied onto the upper surface of the turntable 2 and the wafers W are arranged on the upper surface of the turntable 2, a supplying direction of the first gas and the second gas is approximately perpendicular to the surfaces of the wafers W (deposition surfaces of the silicon oxide films). Then, the wafers W pass under the lower surfaces of the first gas nozzle 31 and the second gas nozzles 321 and 322 by the rotation of the turntable 2 while keeping a state of the supplying direction of the first gas and the second gas approximately perpendicular to the surfaces of the wafers W. Because of this, the first gas and the second gas can be supplied uniformly to the surfaces of the wafers W, which can make it possible to deposit a silicon oxide film having a uniform film thickness on the surfaces of the wafers W.

As discussed above, by rotating the turntable 2 holding the wafers W while continuously supplying the first gas and the second gas for a predetermined time period, the adsorption step and the reaction step are performed alternatively, and a silicon oxide film having a predetermined film thickness can be deposited on the surfaces of the wafers W. After passing a predetermined time period, the supply of the gases into the vacuum chamber 1 is stopped; the rotation of the turntable 2 is stopped; and the wafers W are carried out of the vacuum chamber 1 by a procedure reverse to the one when carrying the wafers W into the vacuum chamber 1. The film deposition process ends by this procedure.

In this manner, according to the method of manufacturing the silicon oxide film of the embodiments, by rotating the turntable 2 while supplying the first gas and the second gas continuously while rotating the turntable, the first gas and the second gas can be supplied to the surfaces of the wafers W uniformly and alternately. Due to this, a silicon oxide film having a uniform film thickness can be deposited on the surfaces of the wafers W.

Moreover, because hydrogen gas and the oxidation gas are used as the second gas, the silicon-containing gas, which is the first gas, adsorbed on the surfaces of the wafers W can be sufficiently oxidized. Accordingly, it is possible to obtain a stable silicon oxide film that hardly goes on with the oxidation reaction even when the obtained silicon oxide film is further heated. In other words, according to the method of manufacturing the silicon oxide film of the embodiments, a silicon oxide film having a low film contraction percentage can be deposited.

WORKING EXAMPLE

Although a description is given below of working examples of the present invention, the present invention is not limited to the working examples.

Working Example 1

In a working example 1, the film deposition apparatus illustrated in FIGS. 1 through 6 was used, and a silicon oxide film was manufactured on a wafer W by using Tris(dimethylamino) silane $(Si(N(CH_3)_2)_3H)$ (hereinafter also expressed as "3DMAS") as a first gas, hydrogen gas and oxygen gas as a second gas. The following is major film deposition conditions.

Temperature of Wafer: 600 degrees C.
Supply Speed of 3DMAS: 0.3 L/min
Supply Speed of Hydrogen Gas: 0.75 L/min
Supply Speed of Oxygen Gas: 3.0 L/min
Flow Rate of Separation Gas (Flow Rate from Each of Separation Gas Nozzles 41 and 42): 8 slm
Rotational Speed of Turntable: 120 rpm The manufacture of the silicon oxide film was performed by the following procedure as described in the embodiments of the present invention.

To begin with, a wafer was loaded in the film deposition apparatus, and the vacuum chamber 1 was evacuated to the reachable maximum degree of vacuum after closing the not shown gate valve. Furthermore, the separation gas nozzles 41 and 42, the separation gas supply pipe 51, and the purge gas supply pipes 72 and 73 started supplying $N_2$ gas, which is the separation gas.

Next, the rotation of the turntable 2 was started. Here, the heating of the wafer W was performed after loading the wafer W in the film deposition apparatus and until carrying the wafer W out of the vacuum chamber 1 after depositing a silicon oxide film.

Subsequently, the supply of the first gas from the first gas nozzle 31 and the second gases from the second gas nozzles 321 and 322 was started, respectively.

The supply of each gas, the heating of the wafer W and the rotation of the turntable were continued until the silicon oxide film 50 nm thick was deposited on the wafer W.

After ending the deposition of the silicon oxide film, the supply of the gases and the rotation of the turntable were stopped, and the wafer W was taken out of the film deposition apparatus.

The obtained silicon oxide film was heated together with the wafer W in an $N_2$ atmosphere at 850 degrees C. for 30 minutes, and the film contraction percentage of the silicon oxide film was calculated between before and after the heating.

The film thicknesses of the silicon oxide film between before and after the heating process were measured, and the film contraction percentage was calculated by using the following formula.

Film Contraction Percentage(%)={(Film Thickness Before Heating Process)−(Film Thickness After Heating Process)/(Film Thickness Before Heating Process)}×100

The film contraction percentage of the silicon oxide film according to the working example 1 was acknowledged to be 5.9%.

Working Example 2

In a working example 2, a silicon oxide film was deposited on a wafer W similarly to the working example 1 except that ozone gas was used by ozonizing oxygen gas from the oxygen gas supply source by an ozonizer instead of using oxygen gas. At this time, ozone gas was supplied by ozonizing oxygen gas having a flow rate of 3 slm into ozone gas having an ozone concentration of 300 g/Nm³ by the ozonizer.

Then, the film contraction percentage of the obtained silicon oxide film was measured similarly to the working example 1, and the film contraction percentage was acknowledged to be 5.5%.

Comparative Example 1

In a comparative example 1, a silicon oxide film was deposited similarly to the working example 2 except that the supply of hydrogen gas was not performed. In other words, hydrogen gas was not supplied as the second gas, and the silicon oxide film was deposited by only supplying the ozone gas obtained by ozonizing oxygen gas from the oxygen gas supply source by the ozonizer.

The film contraction percentage of the obtained silicon oxide film was measured similarly to the working example 1, and the film contraction percentage was acknowledged to be 7.2%.

Figure 7:
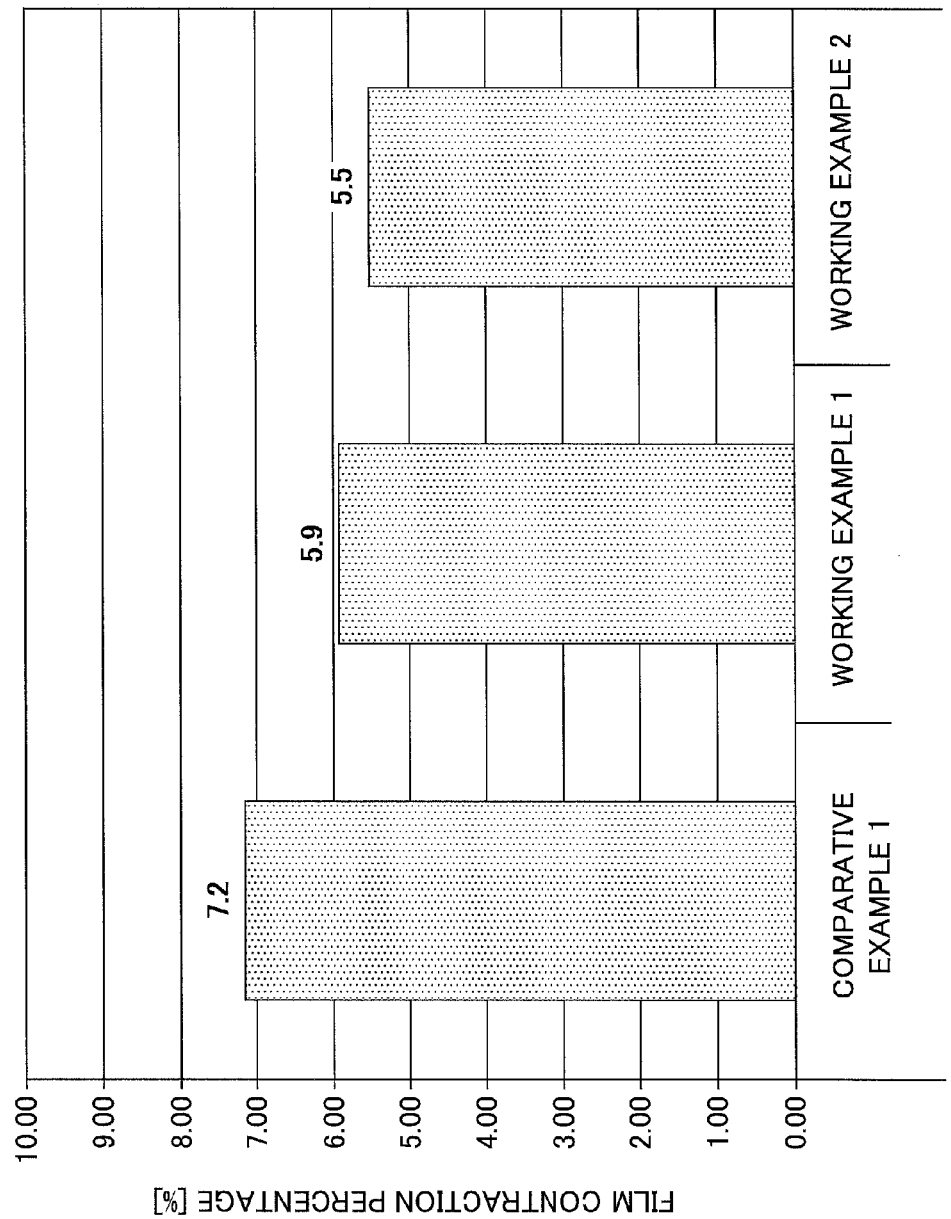
FIG. 7 is a graph for showing a film contraction percentage of a silicon oxide film deposited in a working example and a comparative example of the present invention.

FIG. 7 shows the results of the above-mentioned working examples 1 and 2 and comparative example 1 together. According to this, it is noted that the film contraction percentages of the working examples 1 and 2 in which hydrogen gas was supplied as the second gas in addition to oxygen gas and/or ozone gas were lower than that of the comparative example 1 using only ozone gas without using hydrogen gas. It is contemplated that the radicals and the like such as hydroxyl radicals generated by reacting hydrogen gas with oxygen gas and/or ozone gas could sufficiently promote the oxidation reaction of the first gas adsorbed on the wafer, by which the silicon oxide film having a uniform film property can be deposited as shown by the results in FIG. 7.

According to the method of manufacturing the silicon oxide film of the embodiments of the present invention, a silicon oxide film having a uniform film thickness can be deposited on a surface of a wafer.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A method of manufacturing a silicon oxide film, the method comprising steps of:
   loading a substrate on an upper surface of a turntable provided in a chamber, wherein the turntable includes a plurality of substrate receiving parts arranged along the circumferential direction thereof;
   supplying a silicon-containing gas as a first gas to a first process area provided above the turntable;
   generating hydroxyl radicals by supplying hydrogen gas and oxidation gas as a second gas to a second process area provided above the turntable and heating the substrate up to a predetermined temperature in a range where the hydroxyl radicals can be generated from hydrogen gas and oxidation gas before the second gas reaches the substrate while supplying the first gas to the first process area;
   rotating the turntable so as cause the substrate to alternately pass through the first process area and the second process area;
   causing the first gas to adsorb on the substrate on the upper surface of the turntable in the first process area while rotating the turntable; and
   causing the second gas supplied to the second process area to react with the first gas adsorbed on the substrate in the second process area while rotating the turntable, wherein the step of causing the first gas to adsorb on the substrate and the step of causing the second gas to react with the first gas adsorbed on the substrate are performed on a plurality of substrates placed on the plurality of substrate receiving parts, respectively, in sequence.

2. The method of claim 1,
   wherein the hydrogen gas and the oxidation gas are supplied from two different gas supply parts.

3. The method of claim 1,
   wherein the second gas is supplied from a single gas supply part as a preliminarily mixed gas of the hydrogen gas and the oxidation gas.

4. The method of claim 1, wherein a rotational speed of the turntable is in a range from 5 to 240 rpm while rotating the turntable.

5. The method of claim 1, wherein the substrate is heated up to a temperature in a range from 400 to 900 degrees C. while rotating the turntable.

6. The method of claim 1, wherein a flow rate of the hydrogen gas contained in the second gas is equal to or higher than 0.5 L/min.

* * * * *